(12) United States Patent
Sell

(10) Patent No.: US 7,829,943 B2
(45) Date of Patent: Nov. 9, 2010

(54) LOW-K ISOLATION SPACERS FOR CONDUCTIVE REGIONS

(75) Inventor: Bernhard Sell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/650,995

(22) Filed: Dec. 31, 2009

(65) Prior Publication Data

US 2010/0102400 A1    Apr. 29, 2010

Related U.S. Application Data

(62) Division of application No. 11/500,628, filed on Aug. 7, 2006, now Pat. No. 7,687,364.

(51) Int. Cl.
*H01L 29/94* (2006.01)
(52) U.S. Cl. .................. 257/330; 257/288; 257/900; 257/E27.06; 257/E29.131
(58) Field of Classification Search .................. 257/288, 257/330, 332, 333, 394, 395, 396, 397, 900, 257/E27.06, E29.13, E29.131, E29.255
See application file for complete search history.

(56) References Cited

U.S. PATENT DOCUMENTS

| | | | |
|---|---|---|---|
| 6,627,504 B1 * | 9/2003 | Bertrand et al. | ............. 438/303 |
| 6,649,490 B1 | 11/2003 | Lee et al. | |
| 6,828,219 B2 | 12/2004 | Yang et al. | |
| 2003/0178688 A1 | 9/2003 | Yang et al. | |
| 2004/0188806 A1 | 9/2004 | Chung et al. | |
| 2006/0065937 A1 | 3/2006 | Hoffmann et al. | |
| 2006/0145273 A1 | 7/2006 | Curello et al. | |
| 2007/0281446 A1 | 12/2007 | Winstead et al. | |

OTHER PUBLICATIONS

Non-Final Office Action from U.S. Appl. No. 11/500,628, mailed Jul. 8, 2009, 13 pages.

* cited by examiner

*Primary Examiner*—Davienne Monbleau
*Assistant Examiner*—Eduardo A Rodela
(74) *Attorney, Agent, or Firm*—Blakely, Sokoloff, Taylor & Zafman LLP (57) ABSTRACT

A multi-component low-k isolation spacer for a conductive region in a semiconductor structure is described. In one embodiment, a replacement isolation spacer process is utilized to enable the formation of a two-component low-k isolation spacer adjacent to a sidewall of a gate electrode in a MOS-FET device.

15 Claims, 7 Drawing Sheets

LOW-K ISOLATION SPACERS FOR CONDUCTIVE REGIONS

CROSS-REFERENCE TO RELATED APPLICATIONS

This application is a divisional of U.S. patent application Ser. No. 11/500,628, filed Aug. 7, 2006, the entire contents of which are hereby incorporated by reference herein.

BACKGROUND OF THE INVENTION

1. Field of the Invention

The invention is in the field of Semiconductor Structures.

2. Description of Related Art

For the past several years, the miniaturization and higher packing density of conductive regions in semiconductor structures, such as gate electrodes or metal interconnects, has been accompanied with an increase in fringe capacitance. Fringe capacitance, i.e. "cross-talk," between such conductive regions may be detrimental to the performance of, for example, semiconductor devices or interconnect networks.

In order to overcome any dominant effects of fringe capacitance, higher power input may be provided to the semiconductor structure. However, this approach has drawbacks for today's low power requirements, e.g. extending battery life. Thus, a method to isolate conductive regions in semiconductor structures is described herein.

DETAILED DESCRIPTION

A process for fabricating semiconductor structures and the resultant structures are described. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps, such as patterning steps or wet chemical cleans, are not described in detail in order to not unnecessarily obscure the present invention. Furthermore, it is understood that the various embodiments shown in the figures are illustrative representations and are not necessarily drawn to scale.

Disclosed herein is a multi-component (two or more components) low-k isolation spacer for isolating conductive regions in a semiconductor structure and a method to form a pair of two-component low-k isolation spacers for a gate electrode in a semiconductor device. Multi-component low-k isolation spacers comprised of higher-k upper portions robust to processing conditions and protected lower-k lower portions may enable a reduction in fringe capacitance and, hence, may enable low power operation of conductive regions. Thus, in accordance with an embodiment of the present invention, a multi-component spacer is used to isolate a conductive region in a semiconductor structure, enabling operation of the semiconductor structure with a reduced power consumption.

Isolation spacers may be used to physically separate neighboring conductive regions in a semiconductor structure, while protecting each of the conductive regions during various processing steps. A multi-component low-k isolation spacer may provide the same physical separation and protection of the conductive region as a conventional single-component isolation spacer, but may also enable a reduction in fringe capacitance, i.e. "cross-talk," between conductive regions within a semiconductor structure. In accordance with an embodiment of the present invention, a multi-component low-k isolation spacer is formed directly adjacent to the sidewall of a conductive region. At least a portion of the multi-component isolation spacer is comprised of a low-k material and, therefore, fringe capacitance may be reduced significantly.

In addition to providing protection to and isolation for a conductive region, an isolation spacer should be sufficiently robust to withstand typical processing steps, such as ion bombardment implant steps, wet chemical cleans steps and dry etch steps (e.g. contact formation). Often, a higher-k material is required to provide such a robust isolation spacer, while a lower-k material is usually detrimentally impacted by such processing steps. Thus, in keeping with the requirement of robustness, in accordance with an embodiment of the present invention, at least a portion of the multi-component isolation spacer is comprised of a higher-k material, e.g. a material with a dielectric constant of at least 4.0. In a specific embodiment, the upper portion of the multi-component low-k isolation spacer is comprised of a higher-k material that provides durability and robustness to inhibit degradation of the multi-component low-k isolation spacer during processing steps. Meanwhile, the lower (protected) portion of the multi-component low-k isolation spacer is comprised of a lower-k material that enables a reduced fringe capacitance.

A replacement isolation spacer technique may be used to incorporate a multi-component low-k isolation spacer into a semiconductor structure with a conductive region. For example in accordance with an embodiment of the present invention, a replacement isolation spacer processing scheme is used to form a two-component isolation spacer wherein the top portion of the two-component isolation spacer is comprised of a higher-k material that provides durability and robustness, while the bottom portion is comprised of a lower-k material that enables a reduced fringe capacitance. Thus, the more fragile, lower-k portion is protected by the more robust higher-k portion.

In a metal-oxide-semiconductor field-effect transistor (MOS-FET), the incorporation of a raised source/drain region can increase the fringe capacitance between the raised source/drain region and a nearby gate electrode. Thus, in accordance with an embodiment of the present invention, a multi-component low-k isolation spacer is formed directly between a raised source/drain region and a gate electrode via a replacement isolation spacer processing scheme. The multi-component low-k isolation spacer physically separates (and hinders electrical shortage between) the raised source/drain region and the gate electrode, while mitigating fringe capacitance.

Figure 1:
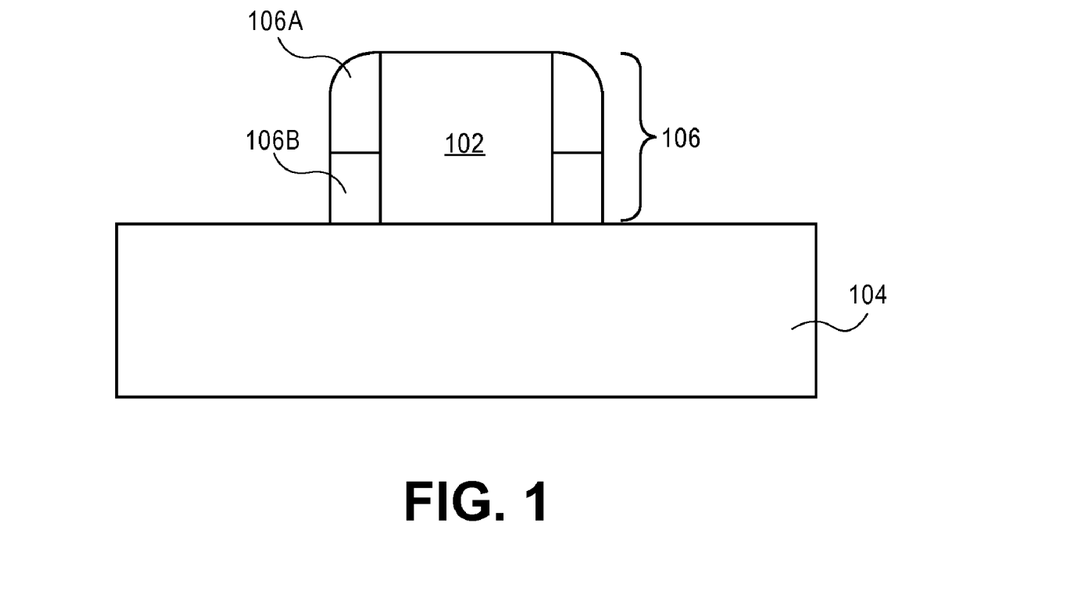
FIG. 1 illustrates a cross-sectional view representing a conductive region isolated by a pair of two-component low-k isolation spacers, in accordance with an embodiment of the present invention.

Multi-component low-k isolation spacers may be used to isolate any conductive region in a semiconductor structure. FIG. 1 illustrates a cross-sectional view representing a conductive region isolated by a pair of two-component low-k isolation spacers, in accordance with an embodiment of the present invention. A conductive region 102 sits above a structure 104 (e.g. a portion of a plurality of interconnects, a semiconductor substrate or an array of semiconductor or electronic devices) and is flanked by a pair of two-component isolation spacers 106, comprised of upper portions 106A and lower portions 106B. In one embodiment of the present invention, both upper portion 106A and lower portion 106B are directly adjacent to the same sidewall of conductive region 102, as depicted in FIG. 1. The widths of upper portion 106A and lower portion 106B need not be the same, however, upper portion 106A should be sufficiently wide as to protect the more fragile lower portion 106B during processing steps. In one embodiment, the width of upper portion 106A is the same as the width of lower portion 106B, as depicted in FIG. 1. In another embodiment, the width of upper portion 106A is greater than the width of lower portion 106B by at least 10 Angstroms. In an embodiment, the width of the top surface of lower portion 106B is in the range of 30-250 Angstroms and the width of bottom surface of upper portion 106B is in the range of 40-400 Angstroms. Lower portion 106B should be of a height sufficient to significantly reduce the fringe capacitance between conductive region 102 and another conductive region. In one embodiment, lower portion has a height of at least 50 Angstroms. Meanwhile, upper portion 106A should be of a height sufficient to protect lower portion 106A during processing steps. In an embodiment, upper portion has a height of at least 200 Angstroms.

Two-component isolation spacer 106, comprised of upper portion 106A and lower portion 106B, may be formed from any dielectric materials capable of suppressing a current flow. The dielectric constant of upper portion 106A should be different from the dielectric constant of lower portion 106B, otherwise a single-component isolation spacer would likely be sufficient. In fact, the dielectric constant of the more robust upper portion 106A should be greater that that of lower portion 106B. Otherwise, in accordance with an embodiment of the present invention, lower portion 106B would not provide the desired reduction in fringe capacitance. Thus, in accordance with an embodiment of the present invention, the dielectric constant of upper portion 106A is greater than the dielectric constant of lower portion 106B. In one embodiment, the dielectric constant of lower portion 106B is in the range of 2.0-4.0 and the dielectric constant of upper portion 106A is in the range of 4.0-7.5. In another embodiment, the dielectric constant of upper portion 106A is at least twice the dielectric constant of lower portion 106B. In an embodiment, lower portion 106B is comprised of silicon dioxide and upper portion 106A is comprised of a material selected from the group consisting of silicon nitride, silicon oxy-nitride and carbon-doped silicon nitride. In one embodiment, the dielectric constant of lower portion 106B is in the range of 2.5-3.5. In an embodiment, lower portion 106B is comprised of a material selected from the group consisting of a porous film or a fluorinated oxide.

Conductive region 102 may be any conductive region in a semiconductor structure. For example, in accordance with an embodiment of the present invention, conductive region 102 is a gate electrode in a MOS-FET device. Thus, in one embodiment, structure 104 is a semiconductor substrate comprising a channel region. In an embodiment, conductive region 102 is a gate electrode comprised of doped polycrystalline silicon or a silicide thereof. In another embodiment, conductive region 102 is a gate electrode comprised of a metal layer such as but not limited to metal nitrides, metal carbides, hafnium, zirconium, titanium, tantalum, aluminum, ruthenium, palladium, platinum, cobalt, nickel or conductive metal oxides, e.g. ruthenium oxide. When conductive region 102 is a gate electrode, it may further comprise a gate dielectric layer between the gate electrode and structure 104. In one embodiment, the gate dielectric layer is formed by a thermal oxidation process and is comprised of silicon dioxide or silicon oxy-nitride. In another embodiment, the gate dielectric layer is formed by chemical vapor deposition or atomic layer deposition and is comprised of a high-k dielectric layer such as, but not limited to, hafnium oxide, zirconium oxide, hafnium silicate, hafnium oxy-nitride or lanthanum oxide.

In accordance with an alternative embodiment of the present invention, conductive region 102 is an interconnect from a plurality of interconnects that connect various electronic and semiconductor devices into a global circuitry. Thus, structure 104 may comprise a portion of a plurality of interconnects or an array of semiconductor or electronic devices. In one embodiment, structure 104 is a layer of metal interconnects. In another embodiment, structure 104 is an array of complimentary metal-oxide-semiconductor (CMOS) transistors incased in a dielectric layer. The interconnect 102 may comprise any suitable material that can conduct a current. In one embodiment, the interconnect is comprised of copper, silver, aluminum or an alloy thereof. In another embodiment, the interconnect comprises an array of interspersed carbon nanotubes. The interconnect may comprise a barrier layer, which may comprise any material suitable to inhibit electro-migration within a plurality of interconnects, to prevent oxidation of the interconnect or to provide a surface for nucleation in a damascene process. In one embodiment, the barrier layer is comprised of tantalum, titanium, tantalum nitride, titanium nitride or a combination thereof. The interconnect may also comprise a capping layer. In an embodiment, the capping layer comprises iridium, ruthenium, cobalt, cobalt/tungsten alloy, cobalt/tungsten phosphide, cobalt boron phosphide or a combination thereof.

A replacement isolation spacer technique may be used to incorporate a multi-component low-k isolation spacer into a semiconductor structure with a conductive region, e.g. a gate electrode. FIGS. 2A-K illustrate cross-sectional views representing the formation of a planar MOS-FET with a gate electrode isolated by a pair of two-component low-k isolation spacers, in accordance with an embodiment of the present invention.

Figure 2A:
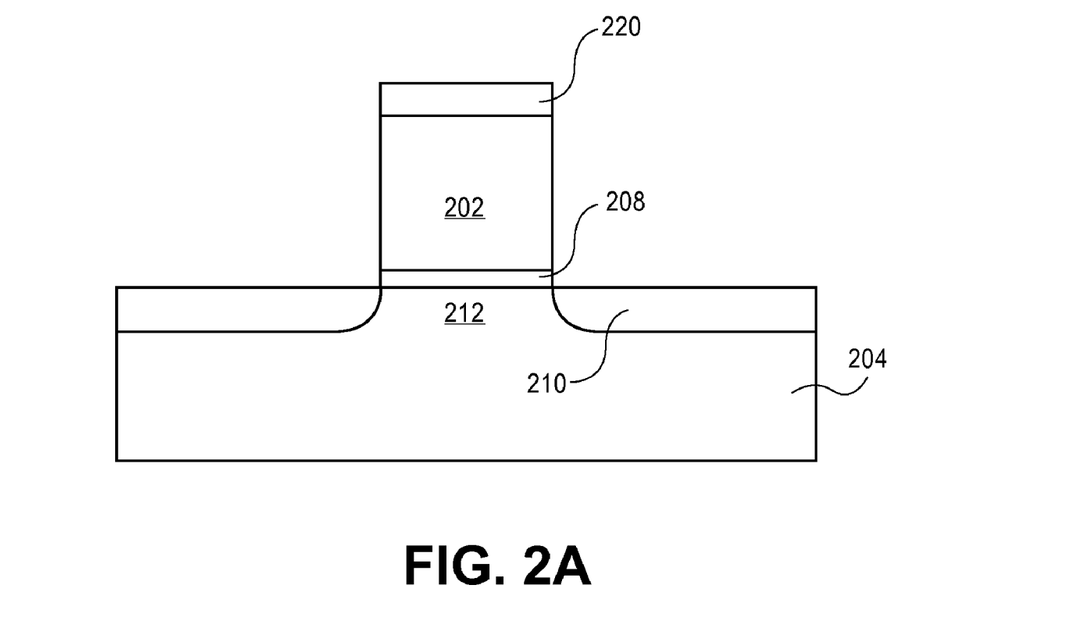
FIGS. 2A-K illustrate cross-sectional views representing the formation of a planar MOS-FET with a gate electrode isolated by a pair of two-component low-k isolation spacers, in accordance with an embodiment of the present invention.
Figure 2B:
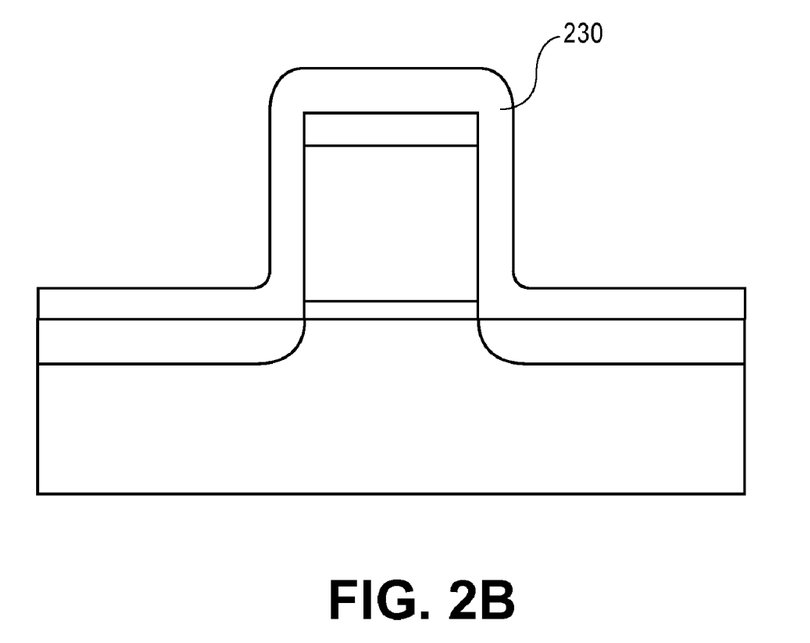

Referring to FIG. 2A, a gate electrode 202 may be formed above a substrate 204. Substrate 204 may be non-insulating and may comprise a semiconducting material or epitaxial layer. In one embodiment, substrate 204 is formed by doping a crystalline silicon, germanium or silicon/germanium layer with an appropriate charge carrier, such as but not limited to phosphorus, arsenic, boron, indium or a combination thereof. In another embodiment, substrate 204 is comprised of a III-V material such as but not limited to gallium nitride, gallium phosphide, gallium arsenide, indium phosphide or indium antimonide. In one embodiment, substrate 204 is comprised of an epitaxial layer grown atop a distinct crystalline substrate. In accordance with another embodiment of the present invention, substrate 204 comprises an insulating layer. In one embodiment, the insulating layer is comprised of silicon dioxide, silicon nitride, silicon oxy-nitride or a high-k dielectric layer. In an embodiment, substrate 204 is comprised of an epitaxial layer and a bulk crystal substrate with an insulating layer between the bulk crystal substrate and the epitaxial layer forming, for example, a silicon-on-insulator substrate.

A gate dielectric layer 208 may be formed between substrate 204 and gate electrode 202, as depicted in FIG. 2A. In one embodiment, gate dielectric layer 208 is formed by a thermal oxidation process and is comprised of silicon dioxide or silicon oxy-nitride. In another embodiment, gate dielectric layer 208 is formed by chemical vapor deposition or atomic layer deposition and is comprised of a high-k dielectric layer such as, but not limited to, hafnium oxide, zirconium oxide, hafnium silicate, hafnium oxy-nitride or lanthanum oxide.

Gate electrode 202 may comprise any conductive material and may be formed by a subtractive etching process scheme or by a replacement gate process scheme. In one embodiment, gate electrode 202 is comprised of a polycrystalline silicon gate electrode, wherein the charge-carrier dopant impurities are implanted during fabrication of the tip and source/drain regions, described below. In another embodiment, gate electrode 202 is comprised of a metal layer such as but not limited to metal nitrides, metal carbides, hafnium, zirconium, titanium, tantalum, aluminum, ruthenium, palladium, platinum, cobalt, nickel or conductive metal oxides, e.g. ruthenium oxide. In one embodiment, a protective layer 220 is retained above gate electrode 202, as depicted in FIG. 2A.

A tip extension 210 may be formed by implanting charge-carrier dopant impurity atoms into 204. Gate electrode 202 may act to mask a portion of substrate 204 to form self-aligned tip extensions 210 and to define a channel region 212. In one embodiment, substrate 204 is comprised of crystalline silicon, germanium or silicon/germanium and the charge-carrier dopant impurity atoms used to form tip extension 210 are selected from the group consisting of boron, arsenic, indium or phosphorus. In another embodiment, substrate 204 is comprised of a III-V material such as but not limited to gallium nitride, gallium phosphide, gallium arsenide, indium phosphide or indium antimonide and the charge-carrier dopant impurity atoms used to form tip extension 210 are selected from the group consisting of carbon, silicon, germanium, oxygen, sulfur, selenium or tellurium.

In accordance with an embodiment of the present invention, a sacrificial gate isolation spacer is used as a placeholder for the subsequent formation of a multi-component low-k isolation spacer. The sacrificial gate isolation spacer should be sufficiently robust to withstand processing steps (e.g. dry etch patterning, wet chemical cleans and ion bombardment implant) that occur prior to its removal, but should also be sufficiently easy to remove when no longer required. Thus, a sacrificial gate isolation spacer may be formed by any suitable technique that provides a robust dielectric layer directly adjacent to the sidewalls of gate electrode 202. In accordance with an embodiment of the present invention, referring to FIG. 2B, a material layer 230 is deposited by a chemical vapor deposition process and is conformal with the structure formed in FIG. 2A. In one embodiment, material layer 230 is comprised of an insulating layer. In a particular embodiment, material layer 230 is comprised of silicon dioxide, silicon oxy-nitride, carbon-doped silicon oxide, a low-temperature furnace oxide or a combination thereof. In another embodiment, material layer 230 is comprised of silicon nitride or carbon-doped silicon nitride. Material layer 230 may be deposited to a thickness selected to determine the final width of the sacrificial gate isolation spacer. In one embodiment, material layer 230 is deposited to a thickness in the range of 30-250 Angstroms.

Figure 2C:
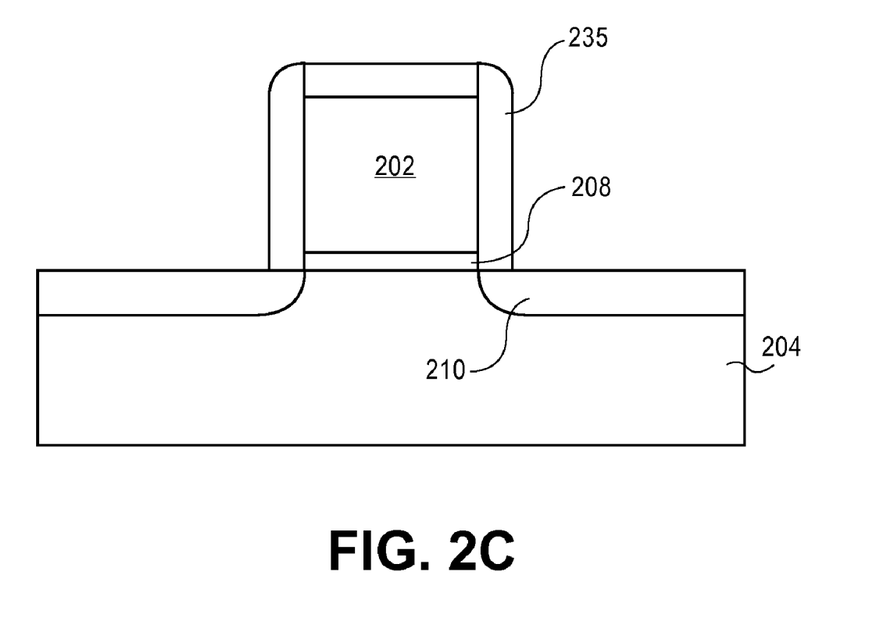

Referring to FIG. 2C, sacrificial isolation spacer 235 is formed from material layer 230 by, for example, an anisotropic etch process. In one embodiment, material layer 230 is dry etched by a remote plasma etch or a reactive ion etch process. In another embodiment, material layer 230 is patterned to form sacrificial isolation spacer 235 by using a vertical dry or plasma etch process comprising fluorocarbons of the general formula $C_xF_y$, where x and y are natural numbers. In another embodiment, material layer 230 is patterned to form sacrificial isolation spacer 235 by using a vertical dry or plasma etch process comprising free radical fluorocarbons. Sacrificial isolation spacer 235 may sit above the top surface of substrate 204 and may have a width substantially equal to the original thickness of material layer 230, i.e. 30 Angstroms to 250 Angstroms. In accordance with an embodiment of the present invention, sacrificial isolation spacer 235 resides above tip extensions 210. In one embodiment, sacrificial isolation spacer 235 forms a hermetic seal with gate electrode 202 and the top surface of substrate 204 to encapsulate gate dielectric layer 208, as depicted in FIG. 2C. In one embodiment, a wet chemical cleaning process step comprising the application of an aqueous solution of hydrofluoric acid, ammonium fluoride or both follows the formation of sacrificial isolation spacer 235.

Figure 2D:
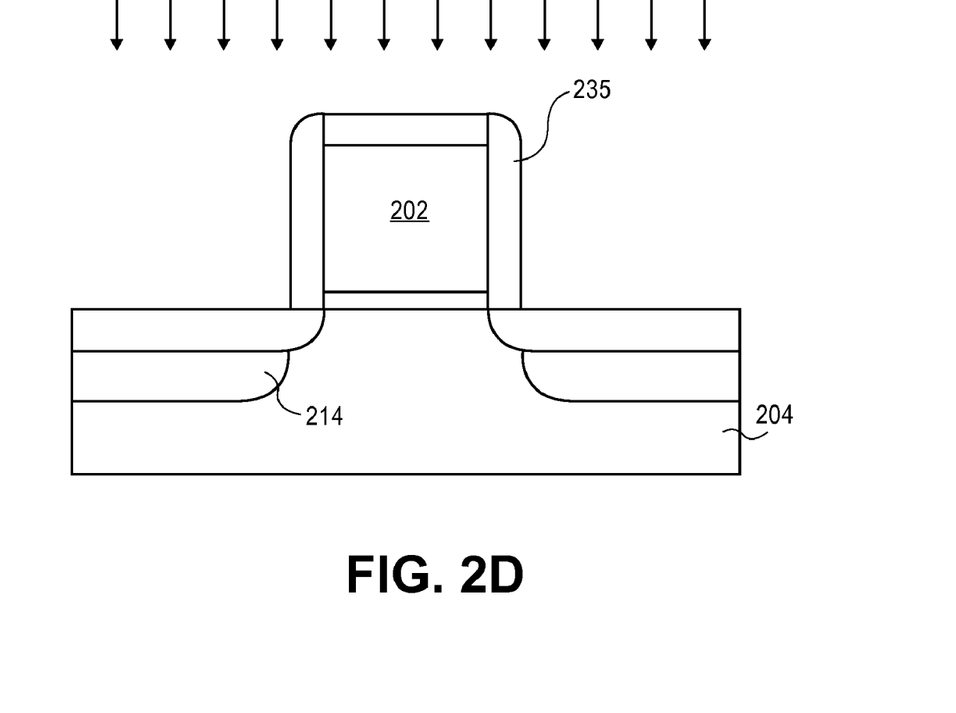

Referring to FIG. 2D, source/drain regions 214 may subsequently be formed by implanting charge carrier dopant impurity atoms into substrate 204. Sacrificial gate isolation spacers 235 and gate electrode 202 may act to mask a portion of substrate 204 to provide self-aligned source/drain regions 214. In effect, the width of sacrificial gate isolation spacer 235 may play a role in determining the dimensions and location of source/drain regions 214. In one embodiment, boron, arsenic, phosphorus, indium or a combination thereof is implanted into substrate 204 to form source/drain regions 214. In another embodiment, the charge-carrier dopant impurity atoms used to form source/drain region 214 are selected from the group consisting of carbon, silicon, germanium, oxygen, sulfur, selenium or tellurium.

Figure 2E:
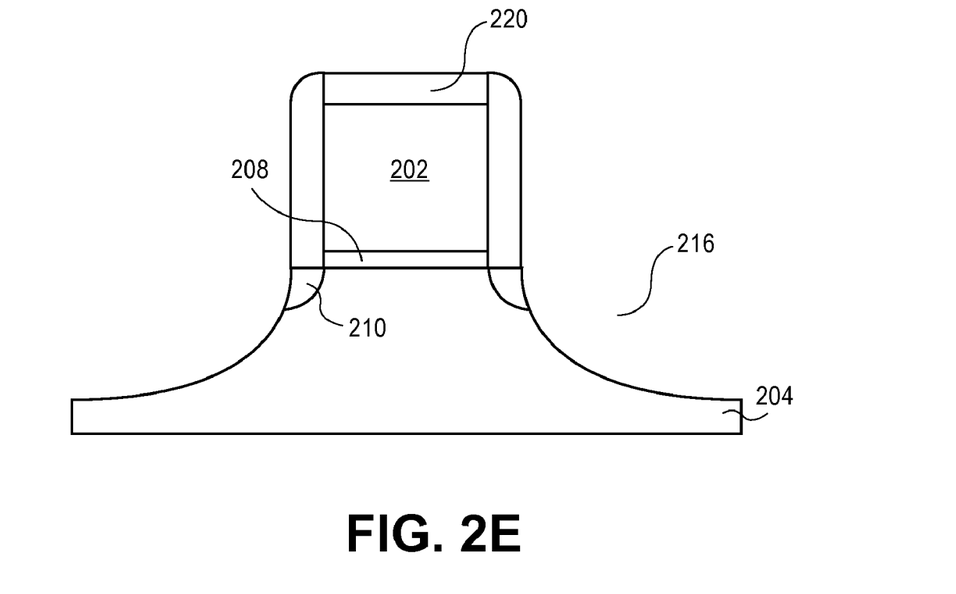

Referring to FIG. 2E, portions of substrate 204, including source/drain region 214, may be removed to form etched-out region 216 in substrate 204. Etched-out region 216 may be formed by any suitable technique that selectively removes a portion of crystalline substrate 204 without significantly impacting gate dielectric layer 208, gate electrode 202 or tip extension 210, such as a dry etch or a wet etch process. In one embodiment, etched-out region 216 is formed by a dry plasma etch using $NF_3$, HBr, $SF_6$/Cl or $Cl_2$ or a wet etch using $NH_4OH$ or tetramethylammonium hydroxide. In one embodiment, protective layer 220 protects gate electrode 202 during the formation of etched-out region 216. In another embodiment, etched-out region 216 is formed to a depth sufficient to remove the charge-carrier dopant impurities implanted to form source/drain region 214, as depicted in FIG. 2E.

Figure 2F:
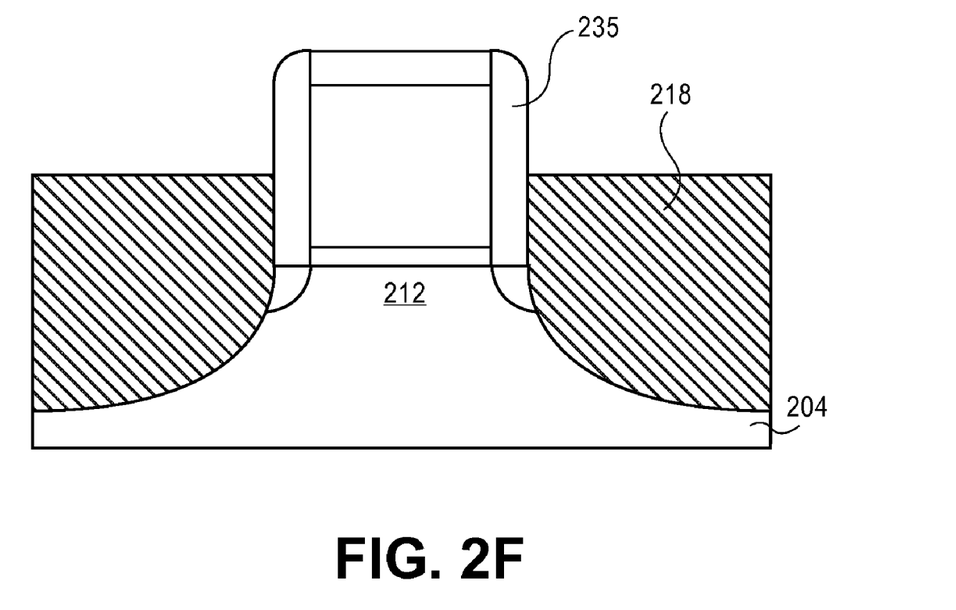

Referring to FIG. 2F, epitaxial source/drain region 218 may be formed selectively in etched-out region 216 from FIG. 2E. In accordance with an embodiment of the present invention, epitaxial source/drain region 218 is a strain-inducing semiconductor region that imparts a compressive uniaxial strain to substrate 204 and, hence, to channel region 212. In another embodiment, epitaxial source/drain region 218 is a strain-inducing semiconductor region that imparts a tensile uniaxial strain to substrate 204 and, hence, to channel region 212. In one embodiment, substrate 204 is comprised of $Si_xGe_{1-x}$ where $0 \leq x \leq 1$ and epitaxial source/drain region 218 is comprised of $Si_yGe_{1-y}$ where $0 \leq y \leq 1$ and $y \neq x$. In another embodiment, substrate 204 is comprised of silicon and epitaxial source/drain region 218 is comprised of carbon-doped silicon. In an embodiment, the top surface of epitaxial source/drain region 218 is raised above the top surface of crystalline substrate 204, as depicted in FIG. 2F.

In accordance with an embodiment of the present invention, charge-carrier dopant impurity atoms are implanted into epitaxial source/drain region 218 either during (i.e. in situ) or subsequent to the formation of epitaxial source/drain region 218. In one embodiment, epitaxial source/drain region 218 is comprised of $Si_xGe_{1-x}$ where $0 \leqq x \leqq 1$ or carbon-doped silicon and the charge-carrier dopant impurity atoms implanted are selected from the group consisting of boron, arsenic, indium or phosphorus. In another embodiment, epitaxial source/drain region 218 is comprised of a III-V material and the charge-carrier dopant impurity atoms implanted are selected from the group consisting of carbon, silicon, germanium, oxygen, sulfur, selenium or tellurium.

Figure 2G:
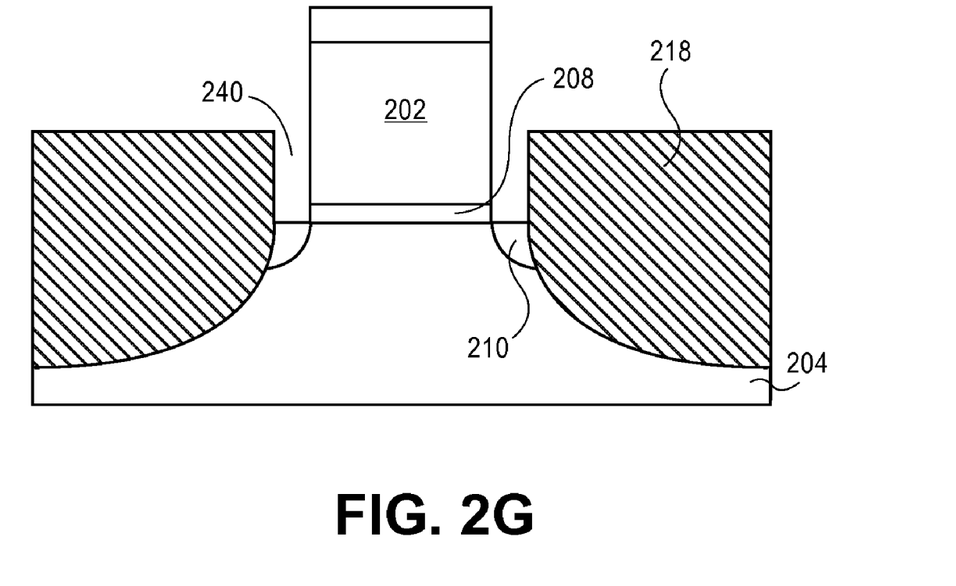
Figure 2H:
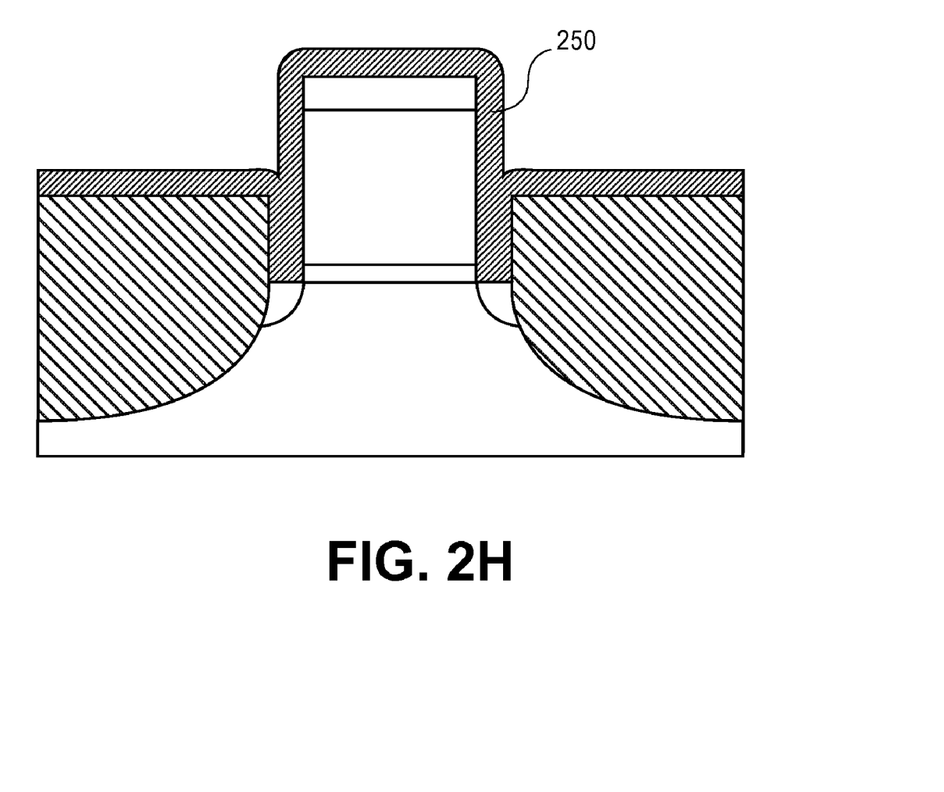

Referring to FIG. 2G, sacrificial isolation spacers 235 may be removed by any suitable technique that does not significantly impact substrate 204, including tip extensions 210 and epitaxial source/drain regions 218, gate dielectric layer 208 or gate electrode 202. In accordance with an embodiment of the present invention, sacrificial isolation spacers 235 are removed by a dry etch or wet etch process. In one embodiment, sacrificial isolation spacers 235 are comprised of silicon dioxide, silicon oxy-nitride, carbon-doped silicon oxide or a low-temperature furnace oxide and are removed with a wet etch comprising aqueous hydrofluoric acid, ammonium fluoride or both. In another embodiment, sacrificial isolation spacers 235 are comprised of silicon nitride or carbon-doped silicon nitride and are removed with a wet etch comprising aqueous phosphoric acid. In accordance with an embodiment of the present invention, upon removal of sacrificial isolation spacer 235, a trench 240 is formed directly between epitaxial source/drain region 218 and gate electrode 202, as depicted in FIG. 2G. In one embodiment, trench 240 has a height in the range of 50-1000 Angstroms.

The structure from FIG. 2G provides a framework for a replacement isolation spacer. In accordance with an embodiment of the present invention, referring to FIG. 2H, a material layer 250 is deposited by a chemical vapor deposition process and is conformal with the structure formed in FIG. 2G. Material layer 250 will ultimately be used to form the lower portion of a multi-component isolation spacer and is therefore comprised of a material that could be detrimentally impacted during typical processing steps (such as ion bombardment implant steps, wet chemical cleans steps and dry etch steps). In one embodiment, material layer 250 is comprised of an insulating layer. In a particular embodiment, material layer 250 is comprised of silicon dioxide, a porous film or a fluorinated oxide. In another embodiment, material layer has a dielectric constant in the range of 2.0-4.0. In one embodiment, material layer has a dielectric constant in the range of 2.5-3.5. Material layer 250 may be deposited to a thickness sufficient to fill trench 240. In an embodiment, material layer 250 is deposited to a thickness in the range of 30-250 Angstroms.

Figure 2I:
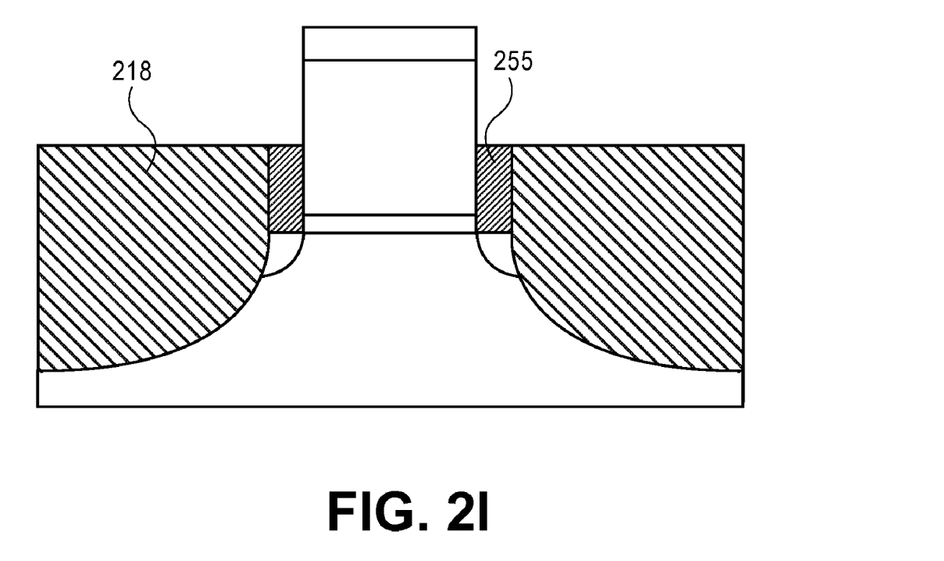
Figure 2J:
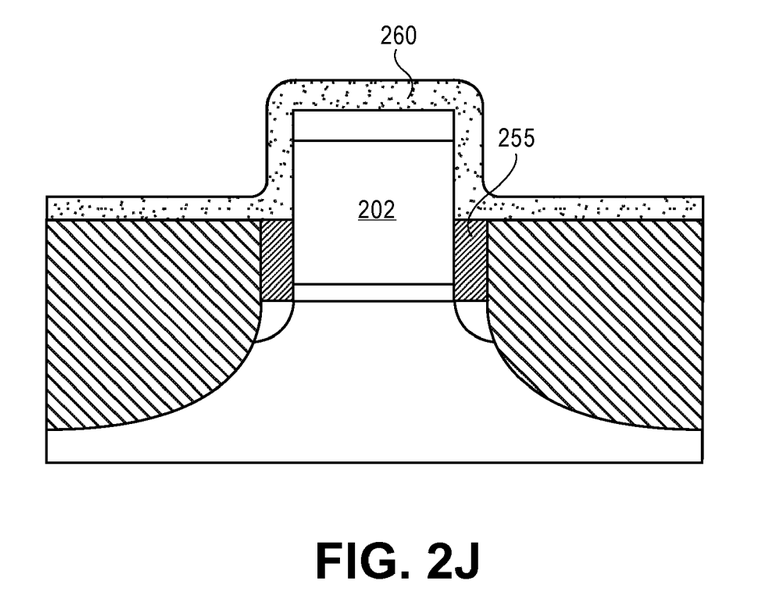

Referring to FIG. 2I, all portions of material layer 250 that are not in trench 240 may be removed to provide lower portions 255 of a replacement low-k isolation spacer. In accordance with an embodiment of the present invention, lower portions 255 are flush with the top surface of epitaxial source/drain regions 218, as depicted in FIG. 2I. In one embodiment, a wet etch process step comprising the application of an aqueous solution of hydrofluoric acid, ammonium fluoride or both may be used to remove those portions of material layer 250 that are not in trench 240.

Upper portions of a replacement low-k isolation spacer may then be formed by any suitable technique that provides a dielectric layer directly adjacent to the sidewalls of gate electrode 202 and above lower portions 255. In accordance with an embodiment of the present invention, referring to FIG. 2J, a material layer 260 is deposited by a chemical vapor deposition process and is conformal with the structure formed in FIG. 2I. In one embodiment, material layer 260 is comprised of an insulating layer. In a particular embodiment, material layer 260 is comprised of silicon dioxide, silicon oxy-nitride, carbon-doped silicon oxide, silicon nitride, carbon-doped silicon nitride or a combination thereof. In another embodiment, material layer 260 has a dielectric constant in the range of 4.0-7.5. In an embodiment, material layer 260 has a dielectric constant at least twice the dielectric constant of lower portion 255. Material layer 260 may be deposited to a thickness selected to determine the final width of the upper portion of a replacement low-k isolation spacer. In one embodiment, material layer 260 is deposited to a thickness in the range of 40-400 Angstroms.

Figure 2K:
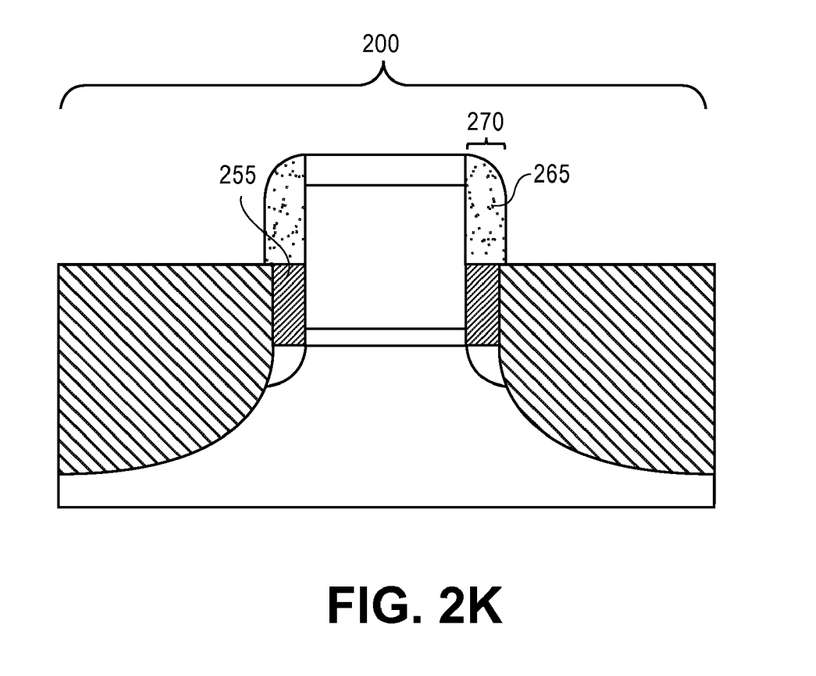

Referring to FIG. 2K, upper portions 265 of a replacement low-k isolation spacer 270 are formed from material layer 260 by, for example, an anisotropic etch process. In one embodiment, material layer 260 is dry etched by a remote plasma etch or a reactive ion etch process. In another embodiment, material layer 260 is patterned to form upper portions 265 by using a vertical dry or plasma etch process comprising fluorocarbons of the general formula $C_xF_y$, where x and y are natural numbers. In another embodiment, material layer 260 is patterned to form upper portions 265 by using a vertical dry or plasma etch process comprising free radical fluorocarbons. In accordance with an embodiment of the present invention, upper portions 265 have a slower etch rate than, i.e. are more robust than and hence protect, lower portions 255. Upper portion 265 sit directly above the top surface of lower portion 255 of replacement low-k isolation spacer 270 and may have a width at the top surface of lower portion 255 substantially equal to the original thickness of material layer 260. In accordance with an embodiment of the present invention, upper portions 265 of replacement low-k isolation spacer are wider than lower portions 255, as depicted in FIG. 2K. In one embodiment, upper portion 265 is at least 10 Angstroms wider than lower portion 255. In another embodiment, the width of upper portion 265 at the top surface of lower portion 255 is in the range of 40-400 Angstroms. In an embodiment, upper portion 265 directly overlaps source/drain region 218, as depicted in FIG. 2K. In one embodiment, upper portion 265 directly overlaps source/drain region 218 by at least 10 Angstroms. In an embodiment, a wet chemical cleaning process step comprising the application of an aqueous solution of hydrofluoric acid, ammonium fluoride or both follows the formation of upper portions 265.

Thus, referring to FIG. 2K, a planar MOS-FET 200 comprising a multi-component low-k isolation spacer may be formed via a replacement isolation spacer process. Planar MOS-FET 200 may be an N-type or a P-type semiconductor device and may be incorporated into an integrated circuit by conventional process steps, as known in the art. As will be appreciated in the typical integrated circuit, both N- and P-channel transistors may be fabricated in a single substrate or epitaxial layer to form a CMOS integrated circuit.

Figure 3:
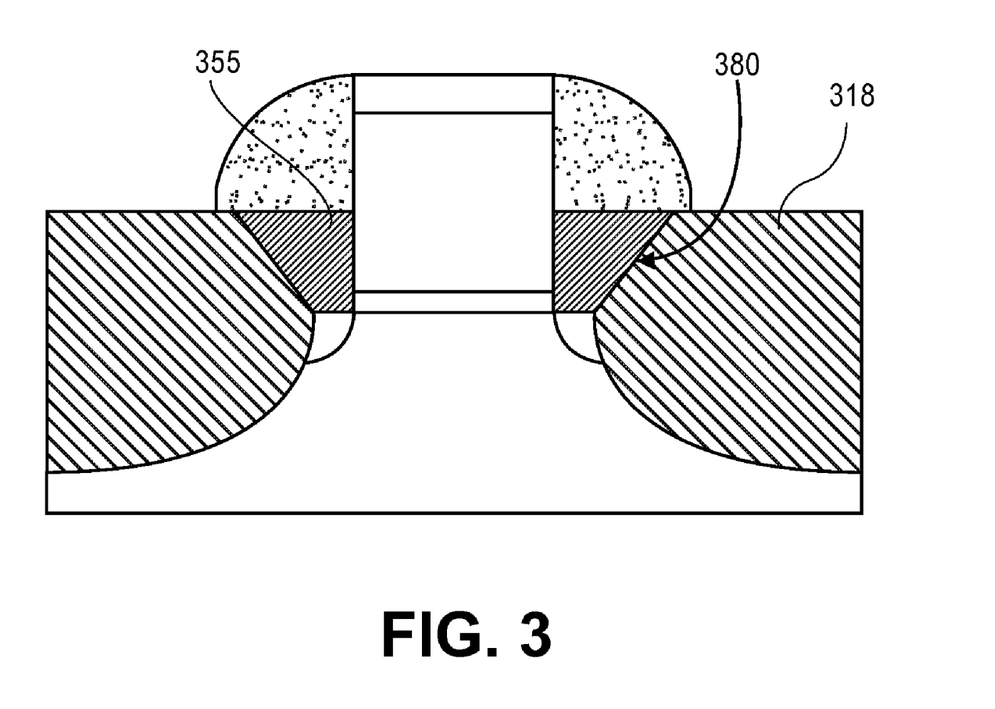
FIG. 3 illustrates a cross-sectional view representing a planar MOS-FET with a gate electrode isolated by a pair of two-component low-k isolation spacers, wherein the source/drain regions are faceted, in accordance with an embodiment of the present invention.

As depicted in FIGS. 2A-K, epitaxial source/drain region 218 may have a facet-less sidewall and may thus be flush with sacrificial isolation spacer 235. In accordance with an embodiment of the present invention, lower portion 255 has a top surface width substantially equal to the width of sacrificial isolation spacer 235. In one embodiment, the top surface width of lower portion 255 is in the range of 30-250 Angstroms. Alternatively, the epitaxial source/drain region may comprise a faceted sidewall. Referring to FIG. 3, epitaxial source/drain region 318 has a faceted sidewall 380. In accordance with an embodiment of the present invention, lower portion 355 has a width greater than the width of the sacrificial isolation spacer. In one embodiment, the top surface width of lower portion 355 is in the range of 75-250 Angstroms. In an embodiment, upper portion 365 directly overlaps source/drain region 318, as depicted in FIG. 3. In one embodiment, upper portion 365 directly overlaps source/drain region 318 by at least 10 Angstroms.

The present invention is not limited to the formation of planar MOS-FETs comprising multi-component low-k isolation spacers. For example, in accordance with an embodiment of the present invention, a bipolar transistor, a memory transistor or a micro-electronic machine (MEM) comprising multi-component low-k isolation spacers is formed. Also, in accordance with another embodiment of the present invention, devices with a three-dimensional architecture, such as independently accessed double gate devices, FIN-FETs, tri-gate devices and gate-all-around devices, are formed incorporating multi-component low-k isolation spacers.

Therefore, a multi-component low-k isolation spacer and its method of formation for use with a conductive region in a semiconductor structure has been described. In one embodiment, a replacement isolation spacer process is utilized to enable the formation of a two-component low-k isolation spacer directly adjacent to the sidewall of a conductive region in a semiconductor device.

What is claimed is:

1. A semiconductor structure comprising:
   a substrate;
   a conductive region disposed above said substrate; and
   a dielectric spacer comprising a first portion and a second portion, wherein said first portion is disposed above said substrate and directly adjacent to a sidewall of said conductive region, the height of said first portion less than the height of said sidewall of said conductive region, and wherein said second portion is disposed directly above said first portion and is directly adjacent to said sidewall of said conductive region, the dielectric constant of said second portion greater than the dielectric constant of said first portion, and the width of said second portion greater than the width of said first portion.

2. The structure of claim 1, wherein the dielectric constant of said second portion is at least twice the dielectric constant of said first portion.

3. The structure of claim 1, wherein the dielectric constant of said first portion is in the range of 2.0-4.0, and wherein the dielectric constant of said second portion is in the range of 4.0-7.5.

4. The structure of claim 3, wherein said first portion comprises a material selected from the group consisting of silicon dioxide, a porous film and a fluorinated oxide, and wherein said second portion comprises a material selected from the group consisting of silicon nitride, silicon oxy-nitride and carbon-doped silicon nitride.

5. The structure of claim 1, wherein the width of the top surface of said first portion is in the range of 30-250 Angstroms.

6. The structure of claim 1, wherein said first portion has a height approximately in the range of 50-1000 Angstroms.

7. A semiconductor device comprising:
   a substrate;
   a gate dielectric layer disposed above said substrate;
   a gate electrode disposed above said gate dielectric layer;
   a source/drain region, wherein the top surface of said source/drain region is above the top surface of said substrate, and wherein a sidewall of said source/drain region is spaced apart from a sidewall of said gate electrode; and
   a dielectric spacer comprising a first portion and a second portion, wherein said first portion is disposed above said substrate and directly between said sidewall of said gate electrode and said sidewall of said source/drain region, the height of said first portion less than the height of said sidewall of said gate electrode, and wherein said second portion is disposed directly above said first portion and is directly adjacent to said sidewall of said gate electrode, the dielectric constant of said second portion greater than the dielectric constant of said first portion, and the width of said second portion greater than the width of said first portion.

8. The structure of claim 7, wherein the dielectric constant of said second portion is at least twice the dielectric constant of said first portion.

9. The structure of claim 7, wherein the dielectric constant of said first portion is in the range of 2.0-4.0, and wherein the dielectric constant of said second portion is in the range of 4.0-7.5.

10. The structure of claim 9, wherein said first portion comprises a material selected from the group consisting of silicon dioxide, a porous film and a fluorinated oxide, and wherein said second portion comprises a material selected from the group consisting of silicon nitride, silicon oxy-nitride and carbon-doped silicon nitride.

11. The structure of claim 7, wherein the width of the top surface of said first portion is in the range of 30-250 Angstroms.

12. The structure of claim 7, wherein said sidewall of said source/drain region is facet-less.

13. The structure of claim 7, wherein said first portion has a height approximately in the range of 50-1000 Angstroms.

14. The structure of claim 7, wherein said sidewall of said source/drain region is faceted.

15. The structure of claim 7, wherein the top surface of said first portion is flush with the top surface of said source/drain region.

* * * * *